United States Patent
Kim et al.

(10) Patent No.: US 10,423,380 B2
(45) Date of Patent: Sep. 24, 2019

(54) DISPLAY MODULE INCLUDING A LIGHT DIFFUSION AGENT AND DISPLAY APPARATUS HAVING THE SAME

(71) Applicant: SAMSUNG ELECTRONICS CO., LTD., Suwon-si (KR)

(72) Inventors: Jae-sang Kim, Seoul (KR); Jee-su Park, Hwaseong-si (KR); Eun-lai Lee, Suwon-si (KR); Jae-min Lee, Suwon-si (KR); Tae-hyeun Ha, Suwon-si (KR); Suk Hyun, Suwon-si (KR); Cheoul-young Kim, Suwon-si (KR); Seung-jae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 337 days.

(21) Appl. No.: 15/166,940

(22) Filed: May 27, 2016

(65) Prior Publication Data

US 2016/0350053 A1 Dec. 1, 2016

(30) Foreign Application Priority Data

May 28, 2015 (KR) ........................ 10-2015-0074954

(51) Int. Cl.
*G09G 5/00* (2006.01)
*G06F 3/14* (2006.01)
(Continued)

(52) U.S. Cl.
CPC ......... *G06F 3/1446* (2013.01); *G02B 5/0278* (2013.01); *G09F 9/30* (2013.01);
(Continued)

(58) Field of Classification Search
CPC ............................................... G09G 2300/026
See application file for complete search history.

(56) References Cited

U.S. PATENT DOCUMENTS 7,538,832 B2 * 5/2009 Hong ................ G02F 1/133603
345/102
2002/0142133 A1 * 10/2002 Matsunaga .......... G02B 5/0221
428/141
(Continued)

FOREIGN PATENT DOCUMENTS

JP 2012008332 A * 1/2012 ........... G02B 5/0247
KR 20100094469 A * 8/2010 ........... G02B 5/0242

OTHER PUBLICATIONS

Dictionary.com definition of coating, http://www.dictionary.com/browse/coating?s=t, p. 1.*
(Continued)

*Primary Examiner* — Gene W Lee
*Assistant Examiner* — Kirk W Hermann
(74) *Attorney, Agent, or Firm* — Sughrue Mion, PLLC (57) ABSTRACT

A display module and a display apparatus having the same are provided. The display module including a circuit board, a plurality of light emitting device packages disposed on the circuit board and electrically coupled to the circuit board, and a coating unit coated with coating solution containing a light diffusion agent covers the plurality of light emitting device packages and fills in a gap between the plurality of light emitting device packages, wherein the coating unit further includes at least one first light diffusion part that is curvedly formed on a surface of the coating unit onto which light emitted from the light emitting device packages is incident.

14 Claims, 10 Drawing Sheets (51) Int. Cl.
*G09F 9/30* (2006.01)
*H01L 51/52* (2006.01)
*H01L 27/32* (2006.01)
*G02B 5/02* (2006.01)

(52) U.S. Cl.
CPC ...... *H01L 27/3293* (2013.01); *H01L 51/5253* (2013.01); *H01L 51/5262* (2013.01); *G09G 2300/026* (2013.01)

(56) References Cited

U.S. PATENT DOCUMENTS

| | | | | |
|---|---|---|---|---|
| 2004/0047042 | A1* | 3/2004 | Takahashi | G02B 5/0242 359/599 |
| 2006/0033859 | A1* | 2/2006 | Yun | G02F 1/133605 349/64 |
| 2006/0262666 | A1* | 11/2006 | Paek | G02B 6/0053 369/1 |
| 2007/0013828 | A1* | 1/2007 | Cho | G02F 1/133308 349/65 |
| 2009/0225506 | A1* | 9/2009 | Lee | H05K 5/0017 361/679.21 |
| 2014/0030833 | A1* | 1/2014 | Sato | H01L 51/0096 438/34 |
| 2015/0060905 | A1* | 3/2015 | Nam | H01L 25/0753 257/89 |

OTHER PUBLICATIONS

Dictionary.com definition of solution, http://www.dictionary.com/browse/solution?s=t, p. 1.*
Dictionary.com definition of package, http://www.dictionary.com/browse/package?s=t, p. 1.*
Google.com definition of lens, www.google.com, p. 1.*
Dictionary.com definition of unit, 2019, http://www.dictionary.com/browse/unit#, p. 1 (Year: 2019).*

* cited by examiner

DISPLAY MODULE INCLUDING A LIGHT DIFFUSION AGENT AND DISPLAY APPARATUS HAVING THE SAME

CROSS-REFERENCE TO RELATED APPLICATION

This application claims priority from Korean Patent Application No. 10-2015-0074954, filed on May 28, 2015 in the Korean Intellectual Property Office, the disclosure of which is incorporated herein by reference in its entirety.

BACKGROUND

Field

Apparatuses and methods consistent with exemplary embodiments relate to a display module and a display apparatus having the same, and more particularly, to a display module with reduced moire and a display apparatus having the same.

Description of the Related Art

In display apparatuses having display modules being used as imaging apparatuses like cameras, it may be difficult for the user to identify a screen due to moire caused in screens of the display apparatuses. As light emitting device packages are arranged in a grid form in the display module, specific spaces may be formed between the light emitting device packages. The moire may be caused by a sharp pattern such as a checkerboard formed by the specific spaces.

In recent years, a method of attaching a diffuser film to the display module has been proposed to overcome the moire. When the diffuser film is used, light emitted from the light emitting device may be diffused through the diffuser film, the specific spaces formed between the light emitting device packages may be filled with the light diffused through the diffuser film, and thus the moire may be reduced.

However, since the diffuser film has to be attached to the display module after the entire surface of the display module is smoothed by coating an adhesive in a space between optical devices, the diffuser film attaching method may be cumbersome. Due to the cumbersome process, the material cost may be increased and the unit cost of the product may be increased.

In response to the diffuser film being attached to the display module, the screen displayed in the display module may be blurred, and a viewing angle may be reduced due to full reflection of the light in a side of the screen. The contrast ratio may be degraded due to the diffuser film.

SUMMARY

Exemplary embodiments may overcome the above disadvantages and other disadvantages not described above. Also, an exemplary embodiment is not required to overcome the disadvantages described above, and an exemplary embodiment may not overcome any of the problems described above.

One or more exemplary embodiments provide a display module with a simplified fabrication process and improved moire, visibility and viewing angle, and a display apparatus having the same.

According to an aspect of an exemplary embodiment, there is provided a display module including a circuit board; a plurality of light emitting device packages disposed on the circuit board and electrically coupled to the circuit board; and a coating unit coated with coating solution containing a light diffusion agent covers the plurality of light emitting device packages and fills in a gap between the plurality of light emitting device packages, wherein the coating unit further includes at least one first light diffusion part that is curvedly formed on a surface of the coating unit onto which light emitted from the light emitting device packages is incident.

According to an aspect of another exemplary embodiment, there is provided a display apparatus including a plurality of display modules, each of the plurality of display modules including a plurality of light emitting device packages and a coating unit, the plurality of light emitting device packages being disposed on a circuit board and electrically coupled to the circuit board, and the coating unit coated with coating solution containing a light diffusion agent covers the plurality of light emitting device packages and fills in a gap between the plurality of light emitting device packages; and a controller configured to electrically couple the plurality of display modules and control the plurality of display modules, wherein the coating unit further includes at least one first light diffusion part that is curvedly formed on a surface of the coating unit onto which light emitted from the plurality of light emitting device packages is incident.

BRIEF DESCRIPTION OF THE DRAWING FIGURES

The above and/or other aspects will be more apparent by describing certain exemplary embodiments with reference to the accompanying drawings, in which.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

Figure 1:
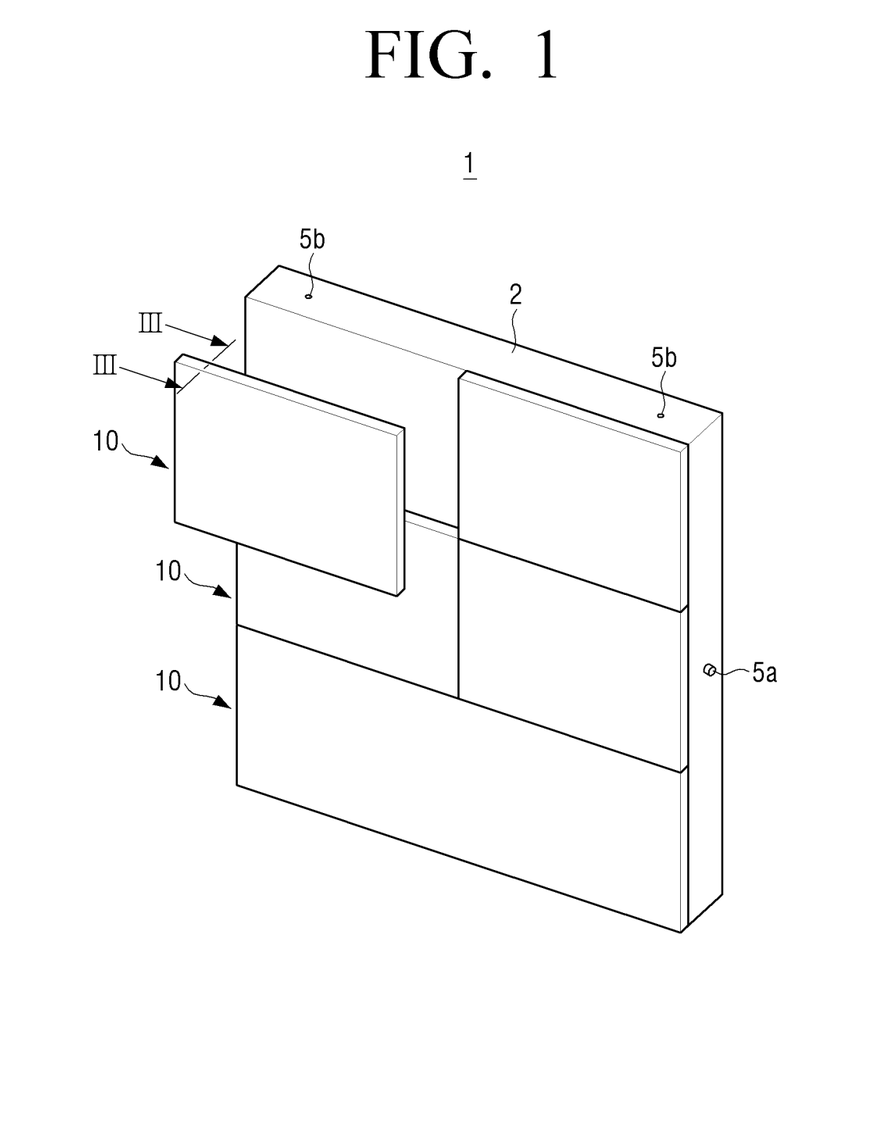
FIG. 1 is a perspective view illustrating a display apparatus according to an exemplary embodiment.

Referring to FIG. 1, the display apparatus 1 according to an exemplary embodiment may include a main body 2 and a plurality of display modules 10.

Figure 2:
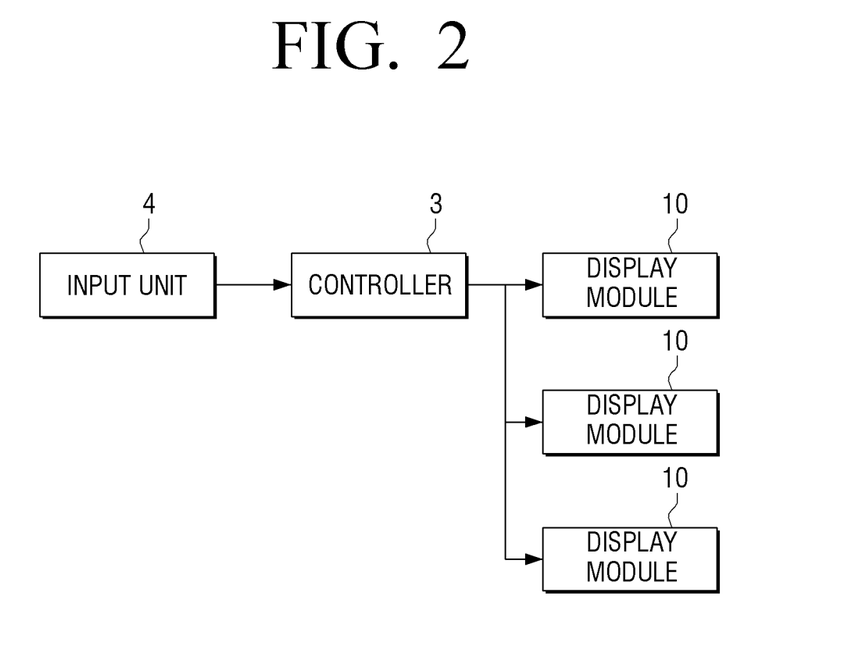
FIG. 2 is a schematic block diagram illustrating a configuration of a display apparatus according to an exemplary embodiment.

The display modules 10 may be disposed on a front surface of the main body 2 and a controller 3 may be included inside the main body 2. Referring to FIG. 2, the controller 3 may be electrically coupled to the plurality of display modules 10, and control an image to be displayed in the plurality of display modules 10. That is, the user may input information for the image to be displayed through an input unit 4, and the controller 3 may receive the information and control the plurality of display modules 10 to display one image in the display apparatus 1.

The main body 2 may include coupling units 5a and 5b in sides thereof to couple and use a plurality of display apparatuses 1. For example, the coupling units 5a and 5b may include a protrusion 5a formed in one side of the main body 2 and a hole 5b formed in the other side of the main body 2. The user may use the plurality of display apparatuses 1 to display a huge image by coupling the plurality of display apparatuses 1 through mutual coupling of the protrusion 5a and the hole 5b. FIG. 1 illustrates that the protrusion 5a is formed in a right side and a lower side of the main body 2 and the hole 5b is formed in a left side and an upper side of the main body 2, but this is not limited thereto, and the positions of the protrusion 5a and the hole 5b may be mutually changed. The protrusion 5a and the hole 5b may be formed in opposite sides of the main body 2 to mutually couple the display apparatuses 1.

Figure 3:
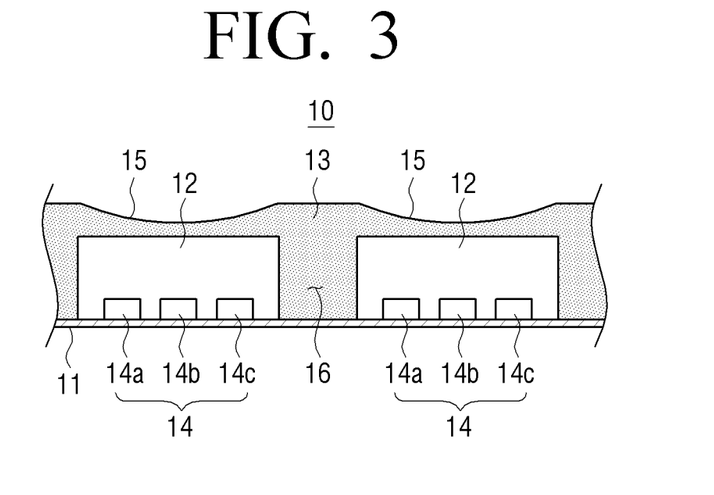
FIG. 3 is a partial cross-sectional diagram illustrating a display module taken along line III-III of FIG. 1.

Referring to FIG. 3, a plurality of display modules 10 according to an exemplary embodiment may be disposed in a front of the main body 2, and the display module 10 may include a circuit board 11, a light emitting device package 12, and a coating unit 13.

The circuit board 11 may be formed of an insulating material such as an epoxy resin or a phenol resin, and may be electrically coupled to a light emitting device 14. The circuit board 11 may be electrically coupled to the controller 3 and the light emitting device 14 may emit specific light according to control of the controller 3.

A plurality of light emitting device packages 12 may be disposed on the circuit board 11, and the light emitting device 14 may be included in each light emitting device package 12.

The plurality of light emitting device packages 12 may be disposed at preset intervals on the circuit board 11 in a grid form, and a gap 16 may be formed between the plurality of light emitting device packages 12. The gap 16 may be the main cause of the moire.

For example, the light emitting device 14 may include a red (R) device 14a, a green (G) device 14b, and a blue (B) device 14c and one R device 14a, one G device 14b, and one B device 14c may be disposed in the light emitting device package 12, but this is not limited thereto. In another example, the light emitting device 14 may include only one among the R device 14a, the G device 14b, and the B device 14c. The light emitting device packages 12 including only corresponding one among the R device 14a, the G device 14b, and the B device 14c may be disposed in order. However, an example that all the R device 14a, the G device 14b, and the B device 14c are included in one light emitting device package 12 will be described in the exemplary embodiment. The arrangement order of the R device 14a, the G device 14b, and the B device 14c may also be changed.

The coating unit 13 may be coating-treated on the circuit board 11 to include the light emitting device packages 12, and may contain at least one among a waterproof agent, silicon, and an antistatic agent. The display module according to an exemplary embodiment may accomplish the waterproof function and the antistatic prevention function and improve a viewing angle. The coating unit 13 may include a first light diffusion part 15 curvedly formed in a portion thereof corresponding to a portion of the circuit board 11 in which the light emitting device package 12 is disposed. For example, the first light diffusion part 15 may be concavely or convexly formed in a gently curved form.

Figure 4:
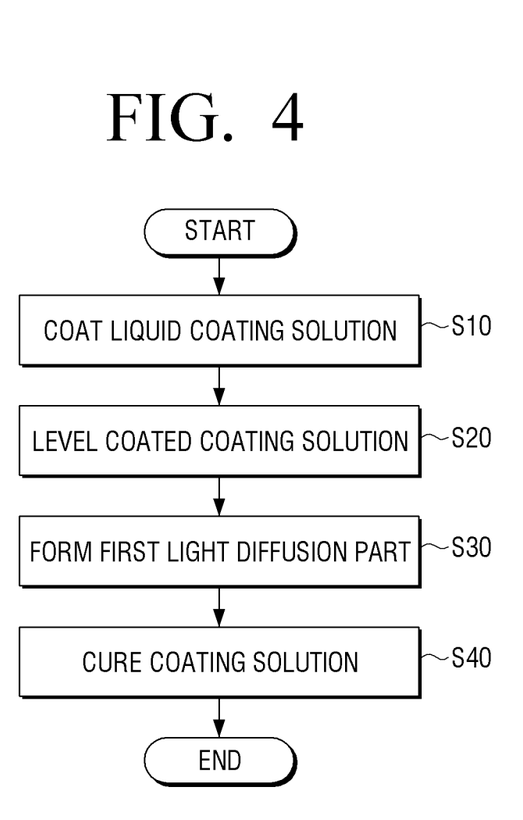
FIG. 4 is a flowchart sequentially illustrating a process of coating-treating a display module illustrated in FIG. 1.

Referring to FIG. 4, a liquid coating solution may be coated higher than a height of the light emitting device package 12 by a preset height (S10), and the coated coating-solution may be leveled out through a roller (S20). Subsequently, the first light diffusion part 15 having a concave form may be formed when the coating solution is pressed using a mold so that the first light diffusion part 15 may face the light emitting device package 12 (S30). The coating solution may be cured (S40).

Since the coating unit 13 contains a light diffusion agent, the light emitted from the light emitting device 14 may pass through the coating unit 13 and may be diffused by scattered reflection. Since the light may also be provided to a portion of the circuit board 11 in which the light is not provided by the gap 16 as a cause of the moire and the grid pattern is formed, the moire may be minimized. Also, it may be unnecessary to coat the adhesive and to attach the separate diffuser film, and thus the fabricating process of the display module 10 may be simplified.

The first light diffusion part 15 may be convexly formed to be away from the light emitting device package 12. Since the light is inverted after a focal length and diffused even in the first light diffusion part 15 having the convex form, the first light diffusion part having the convex form may have the effect similar to the first light diffusion part having the concave form. Even in response to the light being inverted, the entire image is not reversed but an image for an individual pixel is reversed. Accordingly, since the user recognizes the light emitted from the light emitting device 14 as one integrated color, the arrangement order of the pixels may not affect the entire image regardless of the arrangement order of RGB or BGR.

For example, the first light diffusion part 15 may be formed in all portions of the coating unit 13 corresponding to the portions of the circuit board 11 in which the light emitting device packages 12 are formed. In another example, the first light diffusion part 15 may be formed in partial portions of the coating unit 13 corresponding to the portions of the circuit board 11 in which the light emitting device packages 12 are formed.

The light emitted from the light emitting device 14 may be further diffused by the first light diffusion part 15 curvedly formed while passing through the coating unit 13, and an amount of the light provided to the portion of the circuit board 11 in which the light is not provided by the gap 16 and the grid pattern is formed may be increased. Accordingly, the moire and the viewing angle may be improved.

A display apparatus 1 according to another exemplary embodiment will be described with reference to FIG. 5. The same reference numeral is used for the main body 2 as the same element in another exemplary embodiment, and thus detailed description thereof will be omitted and only a display module 20 having a different configuration from the display module 10 will be described.

A plurality of display modules 20 according to another exemplary embodiment may be disposed in a front of the main body 2 and the display module 20 may include a circuit board 21, a light emitting device package 22, and a coating unit 23. However, the circuit board 21 and the light emitting device package 22 are the same as the circuit board 11 and the light emitting device package 12 in an exemplary embodiment, and thus detailed description thereof will be omitted, and only the coating unit 23 having a different configuration from the coating unit 13 will be described.

In an exemplary embodiment, the coating unit 23 may be formed higher than a height of the light emitting device package 22 by a preset height by coating a coating solution containing a light diffusion agent, leveling the coated coating solution through a roller, and curing the leveled coating solution. The coating unit 23 of the display module 20 form a light diffusion part 25 and the first light diffusion part 25 having a curved form may be formed to face the light emitting device package 22 by pressing the coating solution using a mold before the coating solution is cured. For example, the first light diffusion part 25 may be concavely formed as illustrated in FIG. 5. In another example, the first light diffusion part 25 may be convexly formed.

The display module 20 according to another exemplary embodiment may include a second light diffusion part 27 disposed on the coating unit 23 in which the first light diffusion part 25 is formed. The second light diffusion part 27 may include a microlens convexly formed from the first light diffusion part 25. The microlens may be formed through a dropping process of an inkjet coating ink or a nano imprinting process using a mold. However, the method of forming the microlens is not limited thereto, and the microlens may be formed through various methods.

Figure 5:
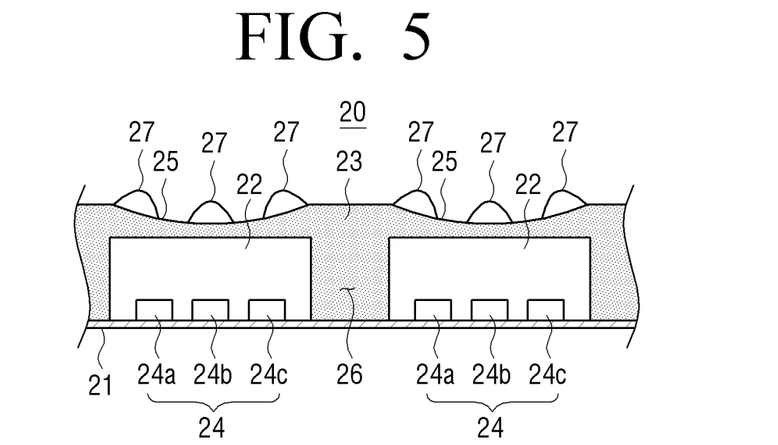
FIG. 5 is a partial cross-sectional diagram illustrating a display module according to another exemplary embodiment.

FIG. 5 illustrates that one second light diffusion part 27 is formed on a central portion of the first light diffusion part 25 and two second light diffusion parts 27 are formed on an edge of the first light diffusion part 25, but this is not limited thereto. Two or more second light diffusion parts 27 may be formed along the edge of the first light diffusion part 25. For example, one second light diffusion part 27 may be disposed on the central portion of the first light diffusion part 25 and four second light diffusion parts 27 may be disposed on the edge of the first light diffusion part 25 to form a mutual right angle in consideration of the unit cost of the product according to a fabrication process of the second light diffusion part 27.

Since the second light diffusion part 27 is formed in the display module 20 according to another exemplary embodiment, the light emitted from the light emitting device 24 may be primarily diffused in the first light diffusion part 25 and secondarily diffused in the second light diffusion part 27. Accordingly, an amount of the light diffused to the portion in which the light is not provided by a gap 26 and thus the grid pattern is formed may be further increased. The moire and the viewing angle may be improved.

Figure 6:
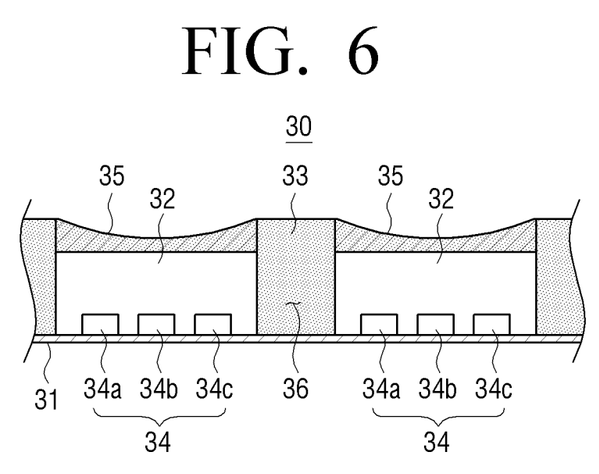
FIG. 6 is a partial cross-sectional diagram illustrating a display module according to another exemplary embodiment.

A display apparatus 1 according to another exemplary embodiment will be described with reference to FIG. 6. The same reference numeral is used for the main body 2 as the same element in another exemplary embodiment, and thus detailed description thereof will be omitted and only a display module 30 having a different configuration from the display module 10 will be described.

A plurality of display modules 30 according to another exemplary embodiment may be disposed in a front of a main body 2 and the display module 30 may include a circuit board 31, a light emitting device package 32, and a coating unit 33. However, the circuit board 31 and the light emitting device package 32 are the same as the circuit board 11 and the light emitting device package 12 in an exemplary embodiment, and thus detailed description thereof will be omitted, and only the coating unit 33 having a different configuration from the coating unit 13 will be described.

The coating unit 33 may contain a light diffusion agent so that light emitted from the light emitting device 34 may be diffused and provided even to a gap 36.

The coating unit 33 according to another exemplary embodiment may be formed in such a manner that an amount of the light diffusion agent contained in a portion of the coating unit 33 corresponding to a portion of the circuit board 31 in which the light emitting device package 32 is disposed may be more than an amount of the light diffusion agent contained in a portion of the coating unit 33 corresponding to a portion of the circuit board 31 in which the gap 36 is formed.

A method of coating the coating unit 33 according to another exemplary embodiment will be described. First, the gap 36 may be filled up with a coating solution containing a relatively small amount of the light diffusion agent up to a height of the light emitting device package 32. Then, a coating solution containing a relatively large amount of the light diffusion agent to be coated on an upper surface of the light emitting device package 32 by a preset height. Subsequently, the coating solution containing a relatively small amount of the light diffusion agent may be coated on the gap 36 by a height of the coating solution coated on the upper surface of the light emitting device package 32. The first light diffusion part 35 may be concavely formed in the coating unit 33 coated on the upper surface of the light emitting device package 32 by pressing the coating solution through a mold so that the first light diffusion part 35 may face the light emitting device package 32. However, the method of coating the coating unit 33 is not limited thereto, and any method of forming the coating unit 33 in such a manner that the portions of the coating unit 33 corresponding to the upper surface of the light emitting device package 32 and the gap 36 contain different amounts of the light diffusion agent from each other may be used.

In the display module 30 according to another exemplary embodiment, the light emitted from the light emitting device 34 may be further diffused in the first light diffusion part 35 and thus the amount of the light provided to the portion in which the light is not be provided by the gap 36 and the grid pattern is formed may be increased. The moire and the visibility may be improved.

A display apparatus 1 according to another exemplary embodiment will be described with reference to FIG. 7. The same reference numeral is used for the main body 2 as the same element in another exemplary embodiment, and thus detailed description thereof will be omitted and only a display module 40 having a different configuration from the display module 10 will be described.

A plurality of display modules 40 according to another exemplary embodiment may be disposed in a front of the main body 2 and the display module 40 may include a circuit board 41, a light emitting device package 42, and a coating unit 43. However, the circuit board 41 and the coating unit 43 are the same as the circuit board 11 and the coating unit 13 in an exemplary embodiment, and thus detailed description thereof will be omitted, and only the light emitting device package 42 having a different configuration from the light emitting device package 12 will be described.

As in an exemplary embodiment, the light emitting device package 42 may include an R device 44a, a G device 44b, and a B device 44c in the inside thereof, but this is not limited thereto. The light emitting device package 42 may include only any one among the R device 44*a*, the G device 44*b*, and the B device 44*c*. The light emitting device packages 42 may be disposed in a grid form, and thus a gap 46 may be formed between the light emitting device packages 42. The gap 46 may be a cause of the moire as described above.

The light emitting device package 42 according to another exemplary embodiment may include a third light diffusion part 48 concavely formed to face the circuit board 41 in a portion thereof facing a first light diffusion part 45. For example, in response to the light emitting device package 42 being fabricated, the user may allow an upper surface of the light emitting device package 42 in which the coating unit 43 is coated to be formed in a curved form through a mold. In this example, the third light diffusion part 48 may be concavely or convexly formed in a gently curved form.

In the light emitting device package 42 according to another exemplary embodiment, light emitted from the light emitting device 44 may be primarily diffused through the third light diffusion part 48 and secondarily diffused through the first light diffusion part 45 of the coating unit 43. Accordingly, the amount of the light provided to the portion in which the light may not be provided by the gap 46 and the grid pattern is formed may be increased, and thus the moire and the visibility may be improved.

The third light diffusion part 48 may also have a convex form like the first light diffusion part 45. For example, the third light diffusion part 48 may be formed on the upper surfaces of all the light emitting device packages 42. In another example, the third light diffusion part 48 may be formed only on upper surfaces of partial light emitting device packages 42.

A display apparatus 1 according to another exemplary embodiment will be described with reference to FIG. 8. The same reference numeral is used for the main body 2 as the same element in another exemplary embodiment, and thus detailed description thereof will be omitted and only a display module 50 having a different configuration from the display module 10 will be described.

A plurality of display modules 50 according to another exemplary embodiment may be disposed in a front of the main body 2 and the display module 50 may include a circuit board 51, a light emitting device package 52, and a coating unit 53. However, the circuit board 51 and the coating unit 53 are the same as the circuit board 11 and the coating unit 13 in an exemplary embodiment, and thus detailed description thereof will be omitted, and only the light emitting device package 52 having a different configuration from the light emitting device package 12 will be described.

The light emitting device package 52 may include an R device 54*a*, a G device 54*b*, and a B device 54*c*, but this is not limited thereto. The light emitting device package 52 may include only one among the R device 54*a*, the G device 54*b*, and the B device 54*c*. The light emitting device packages 52 may be disposed in a grid form, and thus a gap 56 may be formed between the light emitting device packages 52. A third light diffusion part 58 having a curved form may be formed on an upper surface of the light emitting device package 52 as in another exemplary embodiment as illustrated in FIG. 7.

The light emitting device package 52 according to another exemplary embodiment may further include at least one fourth light diffusion part 59*a* formed adjacent to an edge of the third light diffusion part 58.

For example, the fourth light diffusion part 59*a* may be formed to be inclined downward toward the edge of the light emitting device package 52 from the edge of the third light diffusion part 58. In this example, in response to the light emitting device package 52 being fabricated, the fourth light diffusion part 59*a* may be formed through a mold. In another example, the fourth light diffusion part 59*a* may be formed by cutting a corresponding portion of the light emitting device package 52.

In this example, four fourth light diffusion parts 59*a* may be formed along four sides of an upper surface of the light emitting device package 52 through a simple cutting process. However, the fourth light diffusion part 59*a* is not limited thereto, and four light diffusion parts 59*a* or more may be formed or four light diffusion parts 59*a* or less may be formed. For example, four light diffusion parts 59*a* may be formed along the four sides of the upper surface of the light emitting device package 52 and then four fourth light diffusion parts 59*a* may be additionally formed by cutting four vertex portions of the light emitting device package 52.

A boundary portion between the third light diffusion part 58 and the fourth light diffusion part 59*a* may be formed to be rounded.

Figure 7:
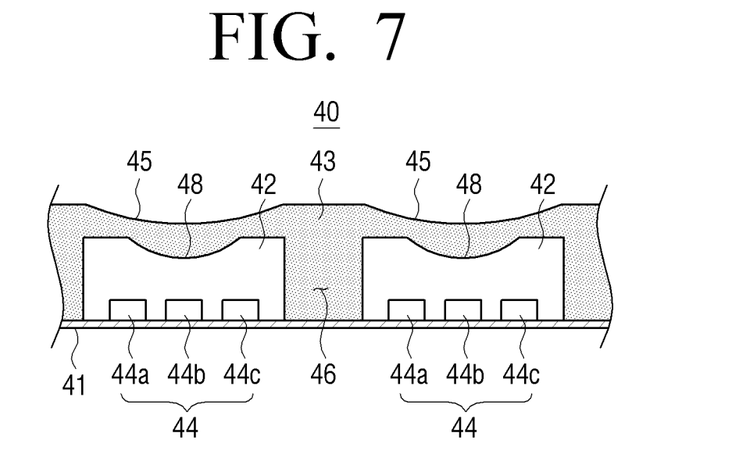
FIG. 7 is a partial cross-sectional diagram illustrating a display module according to another exemplary embodiment.

In the light emitting device package 52 according to another exemplary embodiment, the light emitted from the light emitting device 54 may be diffused through the third light diffusion part 58 and the first light diffusion part 55 as in another exemplary embodiment illustrated in FIG. 7, and light emitted from an edge of the light emitting device package 52 of the light emitted from the light emitting device 54 may be additionally diffused. Accordingly, the amount of the light provided to the portion in which the light may not be provided by the gap 56 and the grid pattern is formed may be increased, and thus the moire and the visibility may be improved.

Figure 8:
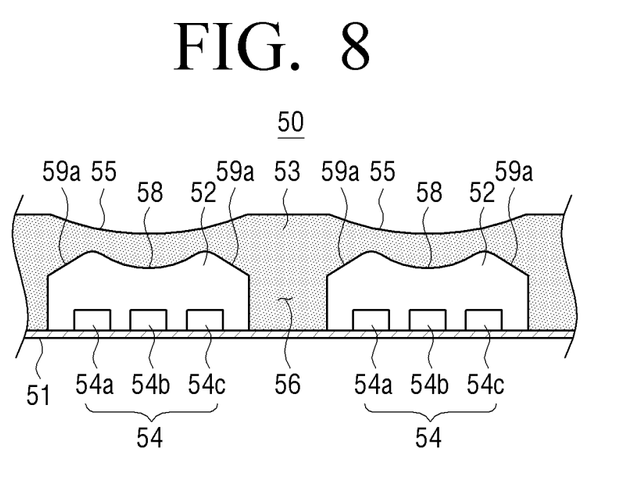
FIG. 8 is a partial cross-sectional diagram illustrating a display module according to another exemplary embodiment.
Figure 9:
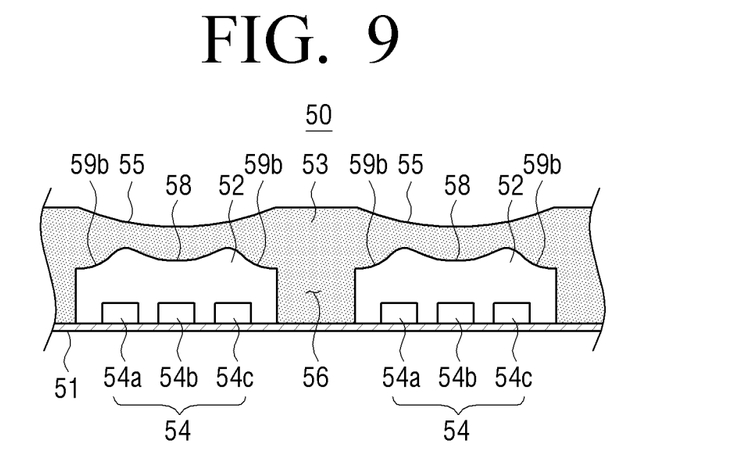
FIGS. 9 and 10 are partial cross-sectional diagrams illustrating modified examples of a fourth light diffusion part illustrated in FIG. 8.
Figure 10:
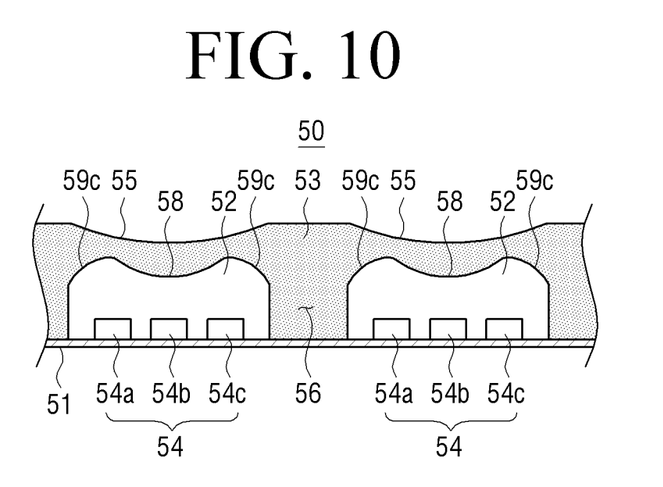

The fourth light diffusion part 59*a* may be formed in a plane form illustrated in FIG. 8, but this is not limited thereto and the fourth light diffusion part may be in a curved form. For example, a fourth light diffusion part 59*b* may be formed in a concave form as illustrated in FIG. 9. In another example, a fourth light diffusion part 59*c* may be formed in a convex form as illustrated in FIG. 10. The user may allow the fourth light diffusion parts 59*b* and 59*c* to be formed through a mold in the concave form as illustrated in FIG. 9 or in the convex form as illustrated in FIG. 10. Accordingly, the light emitted from the light emitting device 54 may be largely irregularly reflected and largely diffused in the fourth light diffusion parts 59*b* and 59*c*, and thus the moire and the visibility may be further improved.

Since the display module according to the exemplary embodiment is coating-treated using a coating solution containing a light diffusion agent, the fabrication process of the display module may be simplified. The moire and the viewing angle may be improved according to additional formation of various light diffusion parts.

The display apparatus according to the exemplary embodiment may be used as a huge display installed in a stage of a venue by coupling a plurality of display apparatuses. Since the moire and the viewing angle are improved in the display apparatus according to the exemplary embodiment, a sharper image may be obtained even in response to the stage may be imaged through an imaging apparatus such as a camera, and audiences in a side of the stage may also view the image displayed through the huge display. Since the display apparatus according to the exemplary embodiment has a waterproof function, the display apparatus may be installed and used in an outdoor stage even on a rainy day. The display apparatus may be used as an outdoor billboard by coupling the plurality of display apparatuses.

The foregoing exemplary embodiments and advantages are merely exemplary and are not to be construed as limiting the inventive concept. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A display module comprising:
a circuit board;
a plurality of light emitting device packages disposed on the circuit board and electrically coupled to the circuit board; and
a coating unit coated with coating solution containing a light diffusion agent covers the plurality of light emitting device packages and fills in a gap between the plurality of light emitting device packages,
wherein the coating unit further comprises at least one first light diffusion part that is curvedly formed on a surface of the coating unit onto which light emitted from the plurality of light emitting device packages is incident,
wherein the at least one first light diffusion part is concavely formed to face a corresponding light emitting device package among the plurality of light emitting device packages,
wherein the corresponding light emitting device package among the plurality of light emitting device packages comprises a third light diffusion part that faces the at least one first light diffusion part and diffuses the light emitted from the corresponding light emitting device package among the plurality of light emitting device packages before the light reaches the surface of the coating unit, and
wherein the third light diffusion part is concavely formed.

2. The display module as claimed in claim 1, wherein an amount of the light diffusion agent contained in a portion of the coating unit in which the at least one first light diffusion part is formed is greater than an amount of the light diffusion agent contained in a remainder portion of the coating unit excluding the portion in which the at least one first light diffusion part is formed.

3. The display module as claimed in claim 1, wherein the corresponding light emitting device package among the plurality of light emitting device packages further comprises at least one fourth light diffusion part disposed close to an edge of the third light diffusion part.

4. The display module as claimed in claim 3, wherein the at least one fourth light diffusion part is formed to be inclined downward toward an edge of the corresponding light emitting device package.

5. The display module as claimed in claim 4, wherein the at least one fourth light diffusion part is curvedly formed.

6. The display module as claimed in claim 5, wherein the at least one fourth light diffusion part is concavely or convexly formed.

7. The display module as claimed in claim 1, wherein the light diffusion agent in the coating unit contains at least one of a waterproof agent, a silicon agent, or an antistatic agent.

8. The display module as claimed in claim 1, wherein the at least one first light diffusion part is formed by pressing the coating solution using a mold before the coating solution is cured.

9. A display module comprising:
a circuit board;
a plurality of light emitting device packages disposed on the circuit board and electrically coupled to the circuit board; and
a coating unit coated with coating solution containing a light diffusion agent covers the plurality of light emitting device packages and fills in a gap between the plurality of light emitting device packages,
wherein the coating unit further comprises at least one first light diffusion part that is curvedly formed on a surface of the coating unit onto which light emitted from the plurality of light emitting device packages is incident,
wherein the at least one first light diffusion part is concavely formed to face a corresponding light emitting device package among the plurality of light emitting device packages,
wherein the display module further comprises at least one second light diffusion part that is curvedly formed on a surface of the at least one first light diffusion part and diffuses the light that is emitted from the corresponding light emitting device package among the plurality of light emitting device packages and passes through the at least one first light diffusion part, and
wherein the at least one second light diffusion part is a convex lens formed through dropping of a coating ink in a preset position on the at least one first light diffusion part.

10. A display apparatus comprising:
a plurality of display modules, each of the plurality of display modules comprising a plurality of light emitting device packages and a coating unit, the plurality of light emitting device packages being disposed on a circuit board and electrically coupled to the circuit board, and the coating unit coated with coating solution containing a light diffusion agent covers the plurality of light emitting device packages and fills in a gap between the plurality of light emitting device packages; and
a controller configured to electrically couple the plurality of display modules and control the plurality of display modules,
wherein the coating unit further comprises at least one first light diffusion part that is curvedly formed on a surface of the coating unit onto which light emitted from the plurality of light emitting device packages is incident,
wherein the at least one first light diffusion part is concavely formed to face a corresponding light emitting device package among the plurality of light emitting device packages,
wherein the corresponding light emitting device package among the plurality of light emitting device packages comprises a third light diffusion part that faces the at least one first light diffusion part and diffuses the light emitted from the corresponding light emitting device package among the plurality of light emitting device packages before the light reaches the surface of the coating unit, and
wherein the third light diffusion part is concavely formed.

11. The display apparatus as claimed in claim 10, wherein the display apparatus further comprises at least one convex lens as a second light diffusion part formed on a surface of the at least one first light diffusion part.

12. The display apparatus as claimed in claim 10, wherein an amount of the light diffusion agent contained in a portion of the coating unit in which the at least one first light diffusion part is formed is greater than an amount of the light diffusion agent contained in a remainder portion of the coating unit excluding the portion in which the at least one first light diffusion part is formed.

13. The display apparatus as claimed in claim 10, wherein the corresponding light emitting device package among the plurality of light emitting device packages further comprises at least one fourth light diffusion part disposed close to an edge of the third light diffusion part.

14. The display apparatus as claimed in claim 13, wherein the at least one fourth light diffusion part is concavely or convexly formed.

* * * * *